(12) United States Patent
Han et al.

(10) Patent No.: US 7,606,110 B2
(45) Date of Patent: Oct. 20, 2009

(54) MEMORY MODULE, MEMORY UNIT, AND HUB WITH NON-PERIODIC CLOCK AND METHODS OF USING THE SAME

(75) Inventors: You-Keun Han, Yonin-si (KR); Hui-Chong Shin, Seongnam-si (KR); Seung-Jin Seo, Suwon-si (KR); Byung-Se So, Sungnam-si (KR); Young-Man Ahn, Yonin-si (KR); Seung-Man Shin, Suwon-si (KR); Jung-Kuk Lee, Yongin-si (KR); Ho-Suk Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 565 days.

(21) Appl. No.: 11/029,008

(22) Filed: Jan. 5, 2005

(65) Prior Publication Data

US 2006/0044927 A1   Mar. 2, 2006

(30) Foreign Application Priority Data

Aug. 31, 2004   (KR) .................... 10-2004-0068811

(51) Int. Cl.
*G11C 8/00* (2006.01)
(52) U.S. Cl. .............. 365/233.1; 365/233.11; 365/233.12; 365/230.01; 365/230.08
(58) Field of Classification Search ............. 365/233.1, 365/233.11, 233.12, 230.01, 230.08
See application file for complete search history.

(56) References Cited

U.S. PATENT DOCUMENTS

| | | | | |
|---|---|---|---|---|
| 5,170,649 A | * | 12/1992 | Lonati | 66/217 |
| 5,311,486 A | * | 5/1994 | Alton et al. | 368/10 |
| 5,359,232 A | * | 10/1994 | Eitrheim et al. | 327/116 |
| 5,485,602 A | * | 1/1996 | Ledbetter et al. | 713/600 |
| 5,689,690 A | * | 11/1997 | Lesmeister et al. | 713/500 |
| 5,786,732 A | * | 7/1998 | Nielson | 331/1 A |
| 5,796,995 A | * | 8/1998 | Nasserbakht et al. | 713/503 |
| 5,815,462 A | * | 9/1998 | Konishi et al. | 365/233 |
| 6,715,096 B2 | * | 3/2004 | Kuge | 713/600 |
| 6,958,925 B1 | * | 10/2005 | Om et al. | 365/49 |
| 7,000,138 B1 | * | 2/2006 | Pillay et al. | 713/600 |
| 7,036,095 B2 | * | 4/2006 | Pavesi et al. | 716/1 |
| 7,126,407 B2 | * | 10/2006 | Furtner | 327/298 |
| 2002/0039324 A1 | * | 4/2002 | Lee | 365/233 |
| 2003/0033551 A1 | * | 2/2003 | Kuhn et al. | 713/401 |
| 2003/0074637 A1 | * | 4/2003 | Pavesi et al. | 716/1 |
| 2005/0027765 A1 | * | 2/2005 | Wells | 708/250 |

* cited by examiner

*Primary Examiner*—Thong Q Le
(74) *Attorney, Agent, or Firm*—Harness, Dickey & Pierce, P.L.C.

(57) ABSTRACT

A memory module, a memory unit, and a hub with a non-periodic clock and methods for using the same. An example memory module may include a phased locked loop, receiving an external, periodic clock and generating one or more internal periodic clocks and a plurality of memory units, receiving one of the internal periodic clocks or a non-periodic clock from an external source.

20 Claims, 12 Drawing Sheets

MEMORY MODULE, MEMORY UNIT, AND HUB WITH NON-PERIODIC CLOCK AND METHODS OF USING THE SAME

PRIORITY STATEMENT

This application claims the benefit under 35 U.S.C. § 119 (a) of Korean Patent Application No. 2004-0068811, filed on Aug. 31, 2004, the contents of which are hereby incorporated by reference in their entirety.

BACKGROUND OF THE INVENTION

Figure 1:
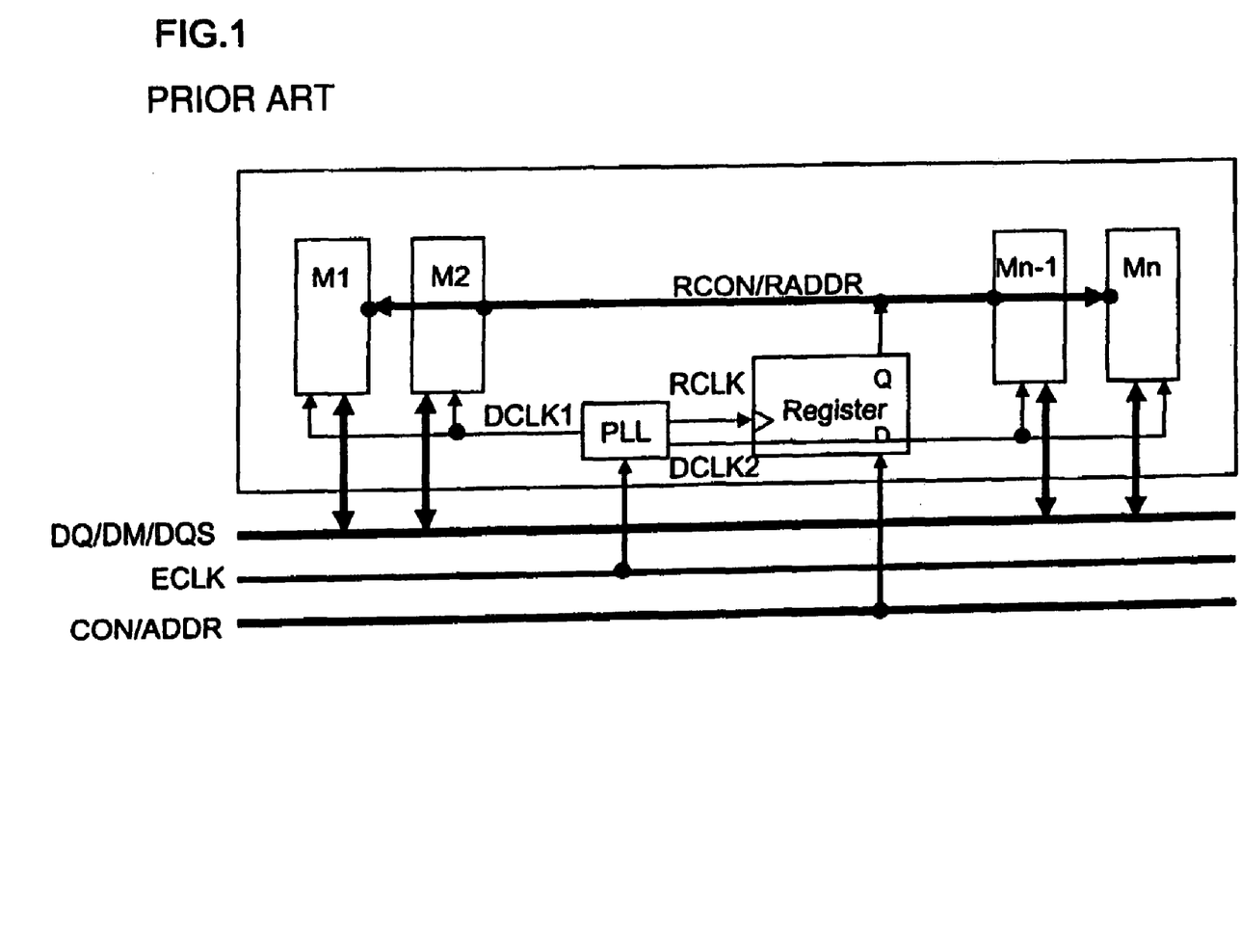
FIG. 1 illustrates a conventional memory module.

FIG. 1 illustrates a conventional memory module which may include a phase locked loop (PLL), a register, and a plurality of memory devices (M1-Mn). The PLL may receive a reference clock (ECLK) from an external device, such as a memory controller, and generate a plurality of clocks (for example, DCLK1, DCLK2, RCLK) having the same phase as the reference clock ECLK. In conventional memory modules, the reference clock ECLK has a constant period.

The register may receive control signals CON, for example, /CS, /RAS, /CAS, /WE and/or other similar control signals) and address signals (ADDR) from an external device and may receive a clock, such as the clock RCLK, from the PLL. The register may output control signals RCON and/or ADDR to the plurality of memory devices M1-Mn, which may be synchronized with the clock RCLK.

The plurality of memory devices M1-Mn may receive one or more of Data (DQ), data mask (DM) and/or data strobe (DQS) signals from an external device, such as memory controller. The plurality of memory devices M1-Mn may also receive one or more of the clock signals, for example, DCLK1 or DCLK2, RCON and/or ADDR, and may generate internal signals which are synchronized with DCLK1 or DCLK2.

A conventional memory module, such as the one illustrated in FIG. 1, is not provided with and may not work with a non-periodic clock. In particular, if a non-periodic clock is supplied to the PLL, the PLL requires a phase locking time whenever a period of the non-periodic clock changes. Generally, it may take several tens of microseconds (μsec) to achieve phase locking. However, if an external device, such as a memory controller, supplies a control signal CON or an address signal ADDR to operate one of plurality of memory devices M1-Mn during the phase locking time, the plurality of memory devices M1-Mn may not properly receive the control signal CON or an address signal ADDR.

Because the plurality of memory devices M1-Mn of the module are operated in accordance with periodic clock signals DCLK1 or DCLK2, a setup time (ts) and a hold time (th) of the control signal CON or an address signal ADDR cannot easily be controlled by a user.

SUMMARY OF THE INVENTION

Example embodiments of the present invention are directed to non-periodic clocks for use in a memory application.

Example embodiments of the present invention are directed to memory modules, memory units, and hubs with non-periodic clocks and methods of using the same.

Example embodiments of the present invention are directed to methods of generating and/or supplying a non-periodic clock for use in a memory application.

An example embodiment of the present invention is directed to a memory module including a phased locked loop, receiving an external, periodic clock and generating one or more internal periodic clocks and a plurality of memory units, receiving one of the internal periodic clocks or a first non-periodic clock from an external source.

Another example embodiment of the present invention is directed to a hub for a memory module including a phased locked loop, receiving an external, periodic clock and generating one or more internal periodic clocks, a set register, receiving a mode set signal and generating one or more control signals, a memory interface register, receiving memory information and supplying the memory information to a plurality of memory units, and a clock selection circuit, receiving a first non-periodic clock, the one of the internal periodic clocks and the one or more control signals, and providing the one of the internal periodic clocks or the first non-periodic clock to the plurality of memory units and the memory interface register depending on the one or more control signals.

Another example embodiment of the present invention is directed to a memory unit including a mode set circuit, receiving an input signal and outputting a mode signal and a clock select circuit, receiving a periodic clock and a non-periodic clock and outputting either the periodic clock or the non-periodic clock, depending on the mode signal.

Another example embodiment of the present invention is directed to a memory unit including a first input pin receiving a periodic clock in a normal mode, a second input pin receiving a non-periodic clock in a test mode, a clock selection circuit, receiving the periodic clock and the non-periodic clock and outputting either the periodic clock or the non-periodic clock, depending on a mode selection signal, and a clock buffer receiving either the periodic clock or the non-periodic clock from the clock select circuit and outputting an internal clock.

Another example embodiment of the present invention is directed to a method of supplying a clock to a memory module having a phased lock loop and a plurality of memory units including supplying a periodic clock to the phased lock loop in a normal mode and supplying a non-periodic clock directly to the plurality of memory units in a test mode.

Another example embodiment of the present invention is directed to a method of supplying a clock to a plurality of memory units in a hub including receiving an external, periodic clock and generating an internal periodic clock, receiving a mode set signal and generating a control signal, receiving control and address information and supplying the control and address information to the plurality of memory units, and receiving a non-periodic clock, the internal periodic clock and the control signal, and providing the internal periodic clock or the non-periodic clock to the plurality of memory units and a memory interface register depending on the control signal.

Another example embodiment of the present invention is directed to a method of generating an internal clock in a memory unit including receiving an input signal and outputting a mode set signal, receiving a periodic clock and a non-periodic clock, selecting either the periodic clock or the non-periodic clock depending on the mode set signal and outputting the selected clock to a clock buffer, and generating the internal clock in response to the selected clock in the clock buffer.

BRIEF DESCRIPTION OF THE DRAWINGS

The present invention will become more fully understood from the detailed description given below and the accompanying drawings, which are given for purposes of illustration only, and thus do not limit the invention.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

DETAILED DESCRIPTION OF EXAMPLE EMBODIMENTS OF THE PRESENT INVENTION

Example embodiments are directed to memory components, such as memory modules, memory units, and/or hubs, which may provide or be provided with one or more periodic clocks and one or more non-periodic clocks.

Example embodiments are directed to memory components, such as memory modules or memory units which may include a memory register or memory interface register.

Example embodiments are directed to memory components, such as memory modules, memory units, and/or hubs, where the one or more periodic clocks or one or more non-periodic clocks is selected based on a mode signal.

Example embodiments are directed to memory components, such as memory modules, memory units, and/or hubs, where one or more periodic clocks or one or more non-periodic clocks is selected for the plurality of memory units or devices and a different one of the periodic clocks or non-periodic clocks is selected for the memory register or memory interface register.

Example embodiments are directed to memory components, such as memory modules, memory units, and/or hubs, where the one or more periodic clocks or one or more non-periodic clocks is selected based on more than one mode signal.

Example embodiments are directed to memory components, that include clock selection circuits for making the above clock selections that are part of memory modules, memory units, and/or hubs.

Figure 2:
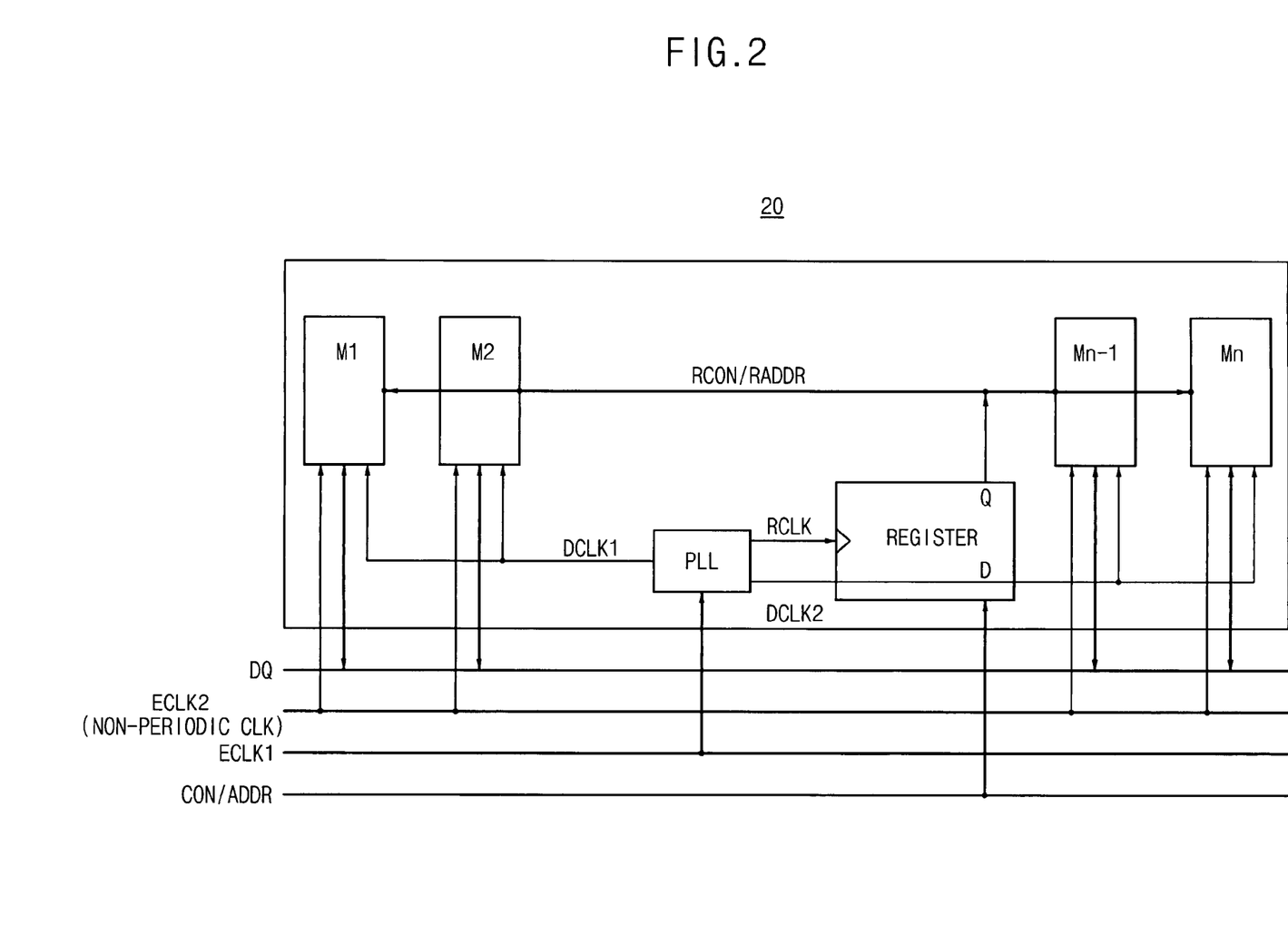
FIG. 2 illustrates a memory module in accordance with an example embodiment of the present invention.

FIG. 2 illustrates a memory module 20 in accordance with an example embodiment of the present invention. As shown in FIG. 2, when the plurality of memory devices M1-Mn are operated using a periodic clock ECLK1, a DQS (or DM) pin of each memory device may receive a DQS (or DM) signal from a tab of the memory module 20. However, when the plurality of memory devices M1-Mn are operated using a non-periodic clock ECLK2, the non-periodic clock may be supplied to the plurality of memory devices M1-Mn through a DQS (or Dm or NC) pin which is connected to a tab of the memory module 20. A non-periodic clock such as ECLK2 is defined as a clock having an irregular period or irregular duty cycle.

Figure 3:
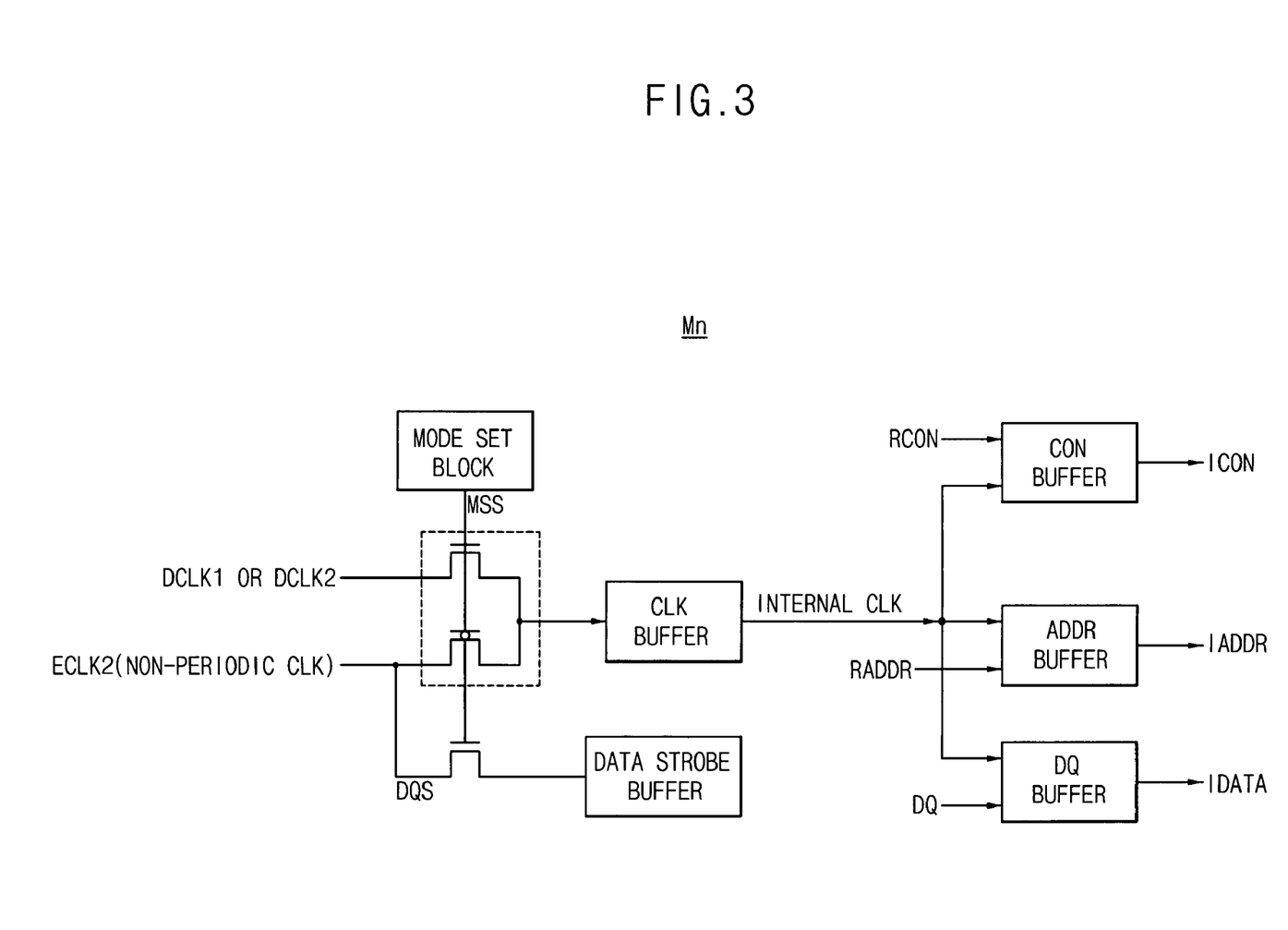
FIG. 3 illustrates a memory device in accordance with an example embodiment of the present invention.

FIG. 3 illustrates a memory device Mn in accordance with an example embodiment of FIG. 2. As shown in FIG. 3, the memory device Mn may include a plurality of input buffers, including a CON buffer to buffer control signals, an ADDR buffer to buffer address signals, and/or a DQ buffer for buffering data signals.

The memory device Mn may also include a first pin for receiving a constant period clock, such as DCLK1, and a second input pin for receiving a non-periodic clock signal, such as, ECLK2 or a data strobe signal (DQS) from a data strobe buffer. The memory device Mn may also include a mode set circuit for outputting a mode set signal (MSS) in accordance with a mode register set (MRS) signal.

In an example operation, if the MRS signal indicates a test mode the non-periodic clock signal, such as, ECLK2, may be input to the second input pin. Otherwise, DQS from the data strobe buffer may be input to the second input pin.

The memory device Mn may also include a clock selection circuit, which receives the periodic clock, such as DCLK1, and the non-periodic clock such as, ECLK2, and outputs one clock to a clock buffer CLK, and selects a clock based on the MSS signal.

In an example embodiment, if the MSS has a high logic level, the clock selection circuit supplies clock DCLK1 to the CLK buffer and a data strobe signal is supplied to a data strobe buffer. If the MSS has a low logic level, the clock selection circuit supplies the ECLK2 clock to the CLK buffer and the data strobe buffer does not receive the data strobe signal.

The CLK buffer receives the clock selected by the clock selection circuit and outputs an internal clock to various other buffers, for example, the CON buffer, the address ADDR buffer and/or the DQ buffer. The CON buffer, the ADDR buffer, and the DQ buffer may also receive input signals RCON, RADDR, and DQ, respectively and output signals ICON, IADDR, and IDATA, respectively, which are in synchronization with the internal clock.

In an example embodiment, the second input pin, which receives the non-periodic clock signal in a test mode, may be a data mask pin or a not connected (NC) pin.

Figure 4:
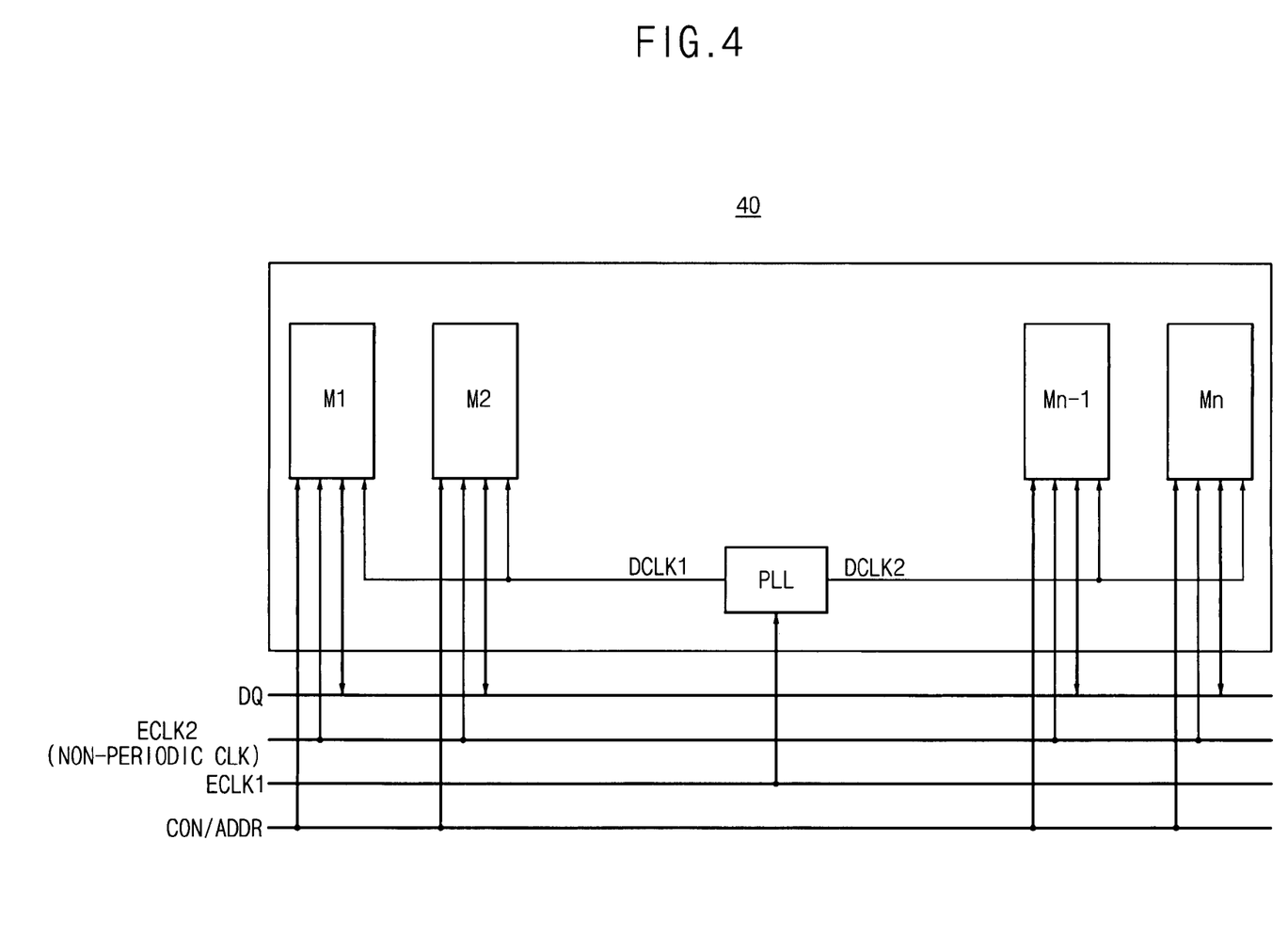
FIG. 4 illustrates a memory module in accordance with another example embodiment of the present invention.

A memory module 40 according to another example embodiment of the present invention is illustrated in FIG. 4. As shown in FIG. 4, the memory module 40 may include a PLL and a plurality of memory devices M1-Mn, such those shown in FIG. 3, but need not include a register. As a result, in the example embodiment shown in FIG. 4, control (CON) signals and address (ADDR) signals may be supplied to the plurality of memory devices M1-Mn directly.

Figure 5:
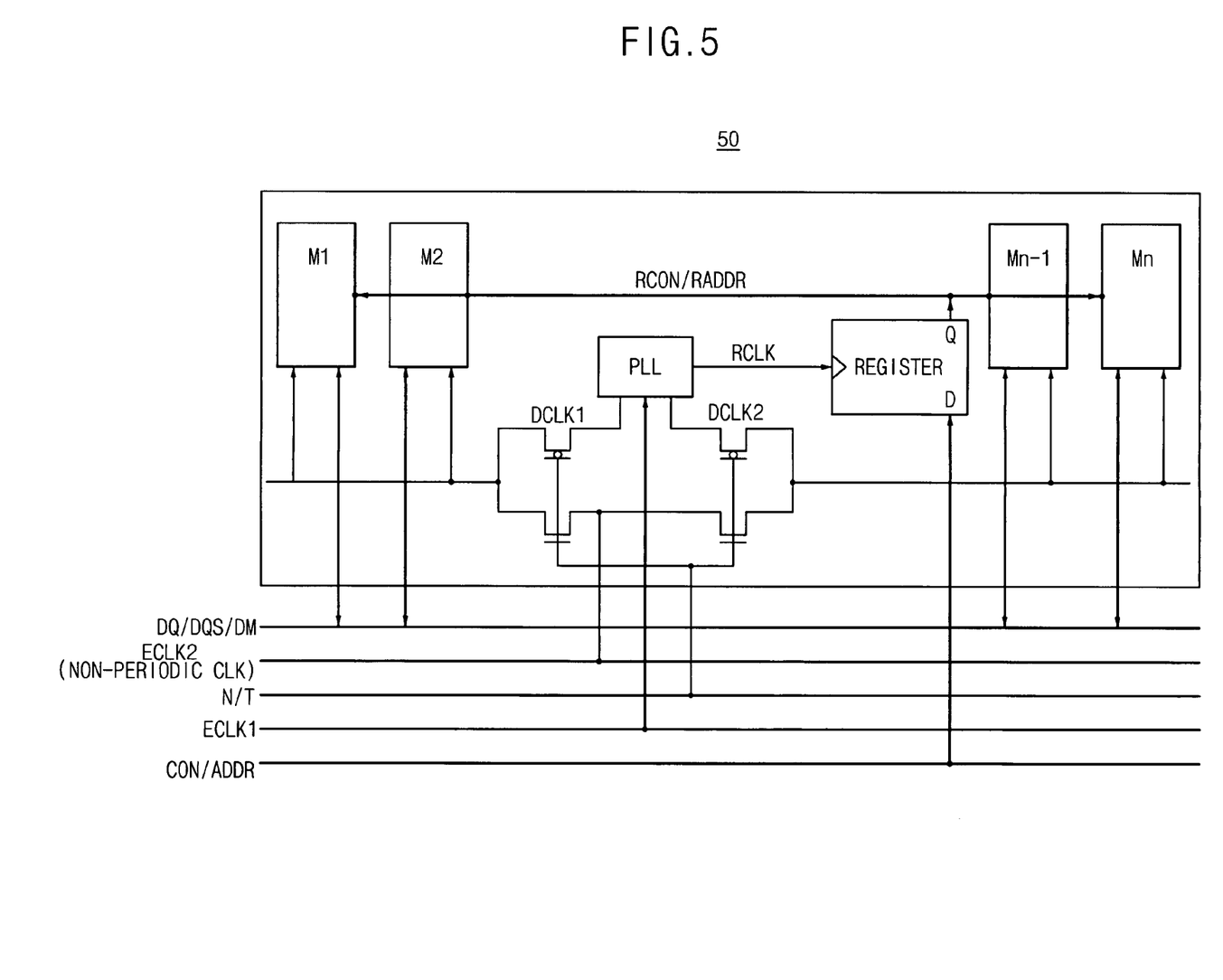
FIG. 5 illustrates a memory module in accordance with another example embodiment of the present invention.

FIG. 5 illustrates a memory module 50 in accordance with another example embodiment of the present invention. As shown in FIG. 5, the memory module 50 may include a PLL, a register, and a plurality of memory devices M1-Mn, such those shown in FIG. 1. The memory module 50 of FIG. 5 may also include a clock selection circuit which may further include a first switch for receiving a period clock DCLK1, for example, from the PLL, and a second switch for receiving a non-periodic clock, for example, from an external device, such as a memory controller.

The clock selection circuit may select one clock according to a mode selection signal (N/T) and outputs the selected clock to the plurality of memory devices M1-Mn. In an example embodiment, the mode selection signal (N/T) may also be supplied from an external device. In an example embodiment, if the mode selection signal (N/T) is a logic low or zero value, the selected mode is a normal operation mode so that the periodic clock DCLK1 or DCLK2 is sent to the plurality of memory devices M1-Mn, and if the mode selection signal (N/T) is a logic high or one value, the selected mode is a non-periodic operation mode, so that the non-periodic clock ECLK2 is sent to the plurality of memory devices M1-Mn.

As shown in FIG. 2, each of the plurality of memory devices M1-Mn includes a clock slection circuit, as shown in FIG. 3. In contrast, the clock selection circuit of FIG. 5 is part of memory module 50, not a part of each of the plurality of memory devices M1-Mn. As a result, the embodiment of FIG. 5 may require less hardware, namely, one clock selection circuit versus n clock selction circuits for FIG. 2, and may incorporate conventional memory devices, which do not include clock selection circuits.

Figure 6:
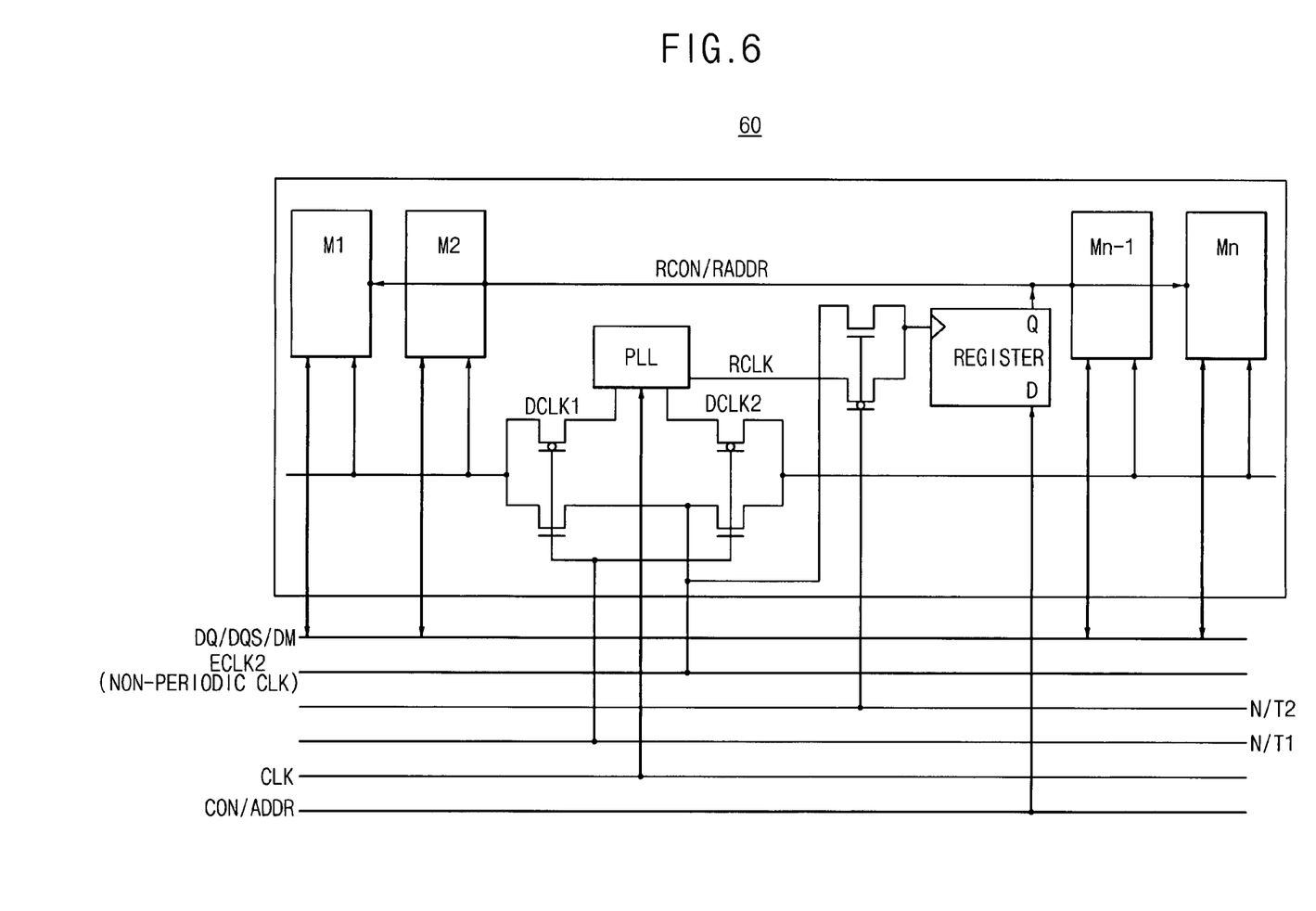
FIG. 6 illustrates a memory module in accordance with another example embodiment of the present invention.

FIG. 6 illustrates a memory module 60 in accordance with another example embodiment of the present invention. As shown in FIG. 6, the memory module 60 may include a PLL, a register, a clock selection circuit, and a plurality of memory devices M1-Mn.

In the example embodiment illustrated in FIG. 6, the clock selection circuit may include a first switch for receiving a period clock DCLK1 from the PLL and a second switch for receiving a non-periodic clock from an external device. The clock selection circuit may select one clock according to a plurality of mode selection signals (N/Tn), for example, mode selection signals (N/T1 and N/T2). In an example embodiment, the mode selection signals N/T1 and N/T2 may be supplied from an external device.

Table 1 illustrates the possible combinations of values of N/T1 and N/T2 so that the register and/or the plurality of memory devices M1-Mn may be controlled with a non-periodic clock or a periodic clock independently.

TABLE 1

| N/T1 | N/T2 | REGISTER | MEMORIES |
|---|---|---|---|
| 0 | 0 | periodic CLK | periodic CLK |
| 0 | 1 | periodic CLK | non-periodic CLK |
| 1 | 0 | non-periodic CLK | periodic CLK |
| 1 | 1 | non-periodic CLK | non-periodic CLK |

Figure 7:
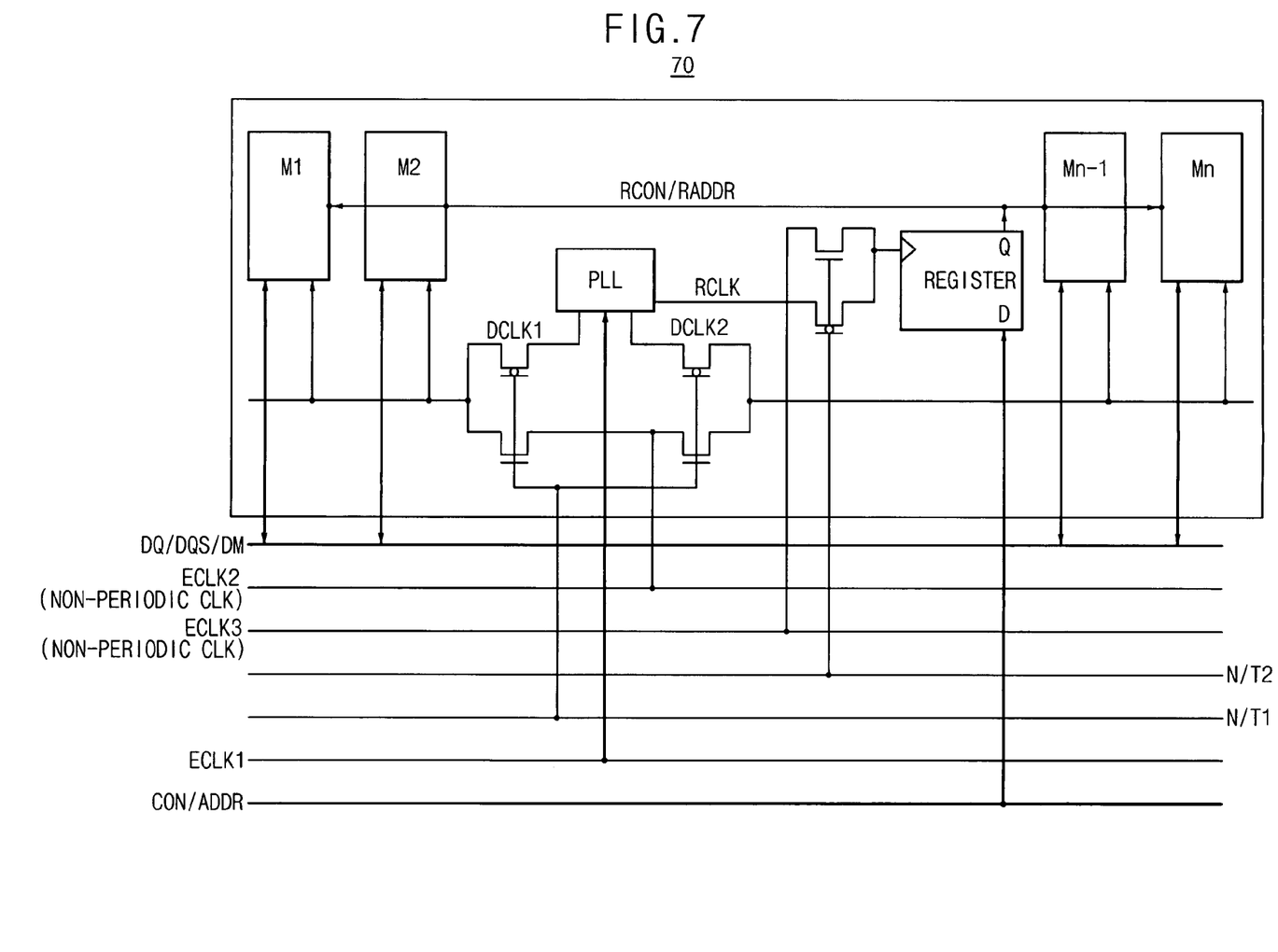
FIG. 7 illustrates a memory module in accordance with another example embodiment of the present invention.

FIG. 7 illustrates a memory module 70 in accordance with another example embodiment of the present invention. As shown, the memory module 70 of FIG. 7 is similar to the memory module 60 of FIG. 6, except that a plurality of non-periodic clocks ECLK2 and ECLK3 may be provided to the memory module 70 of FIG. 7. In an example embodiment illustrated in FIG. 7, non-periodic clocks ECLK2 and ECLK3 may be input to the plurality memory devices M1-Mn and/or to the register in response to the mode selection signals N/T1 and N/T2.

Figure 8:
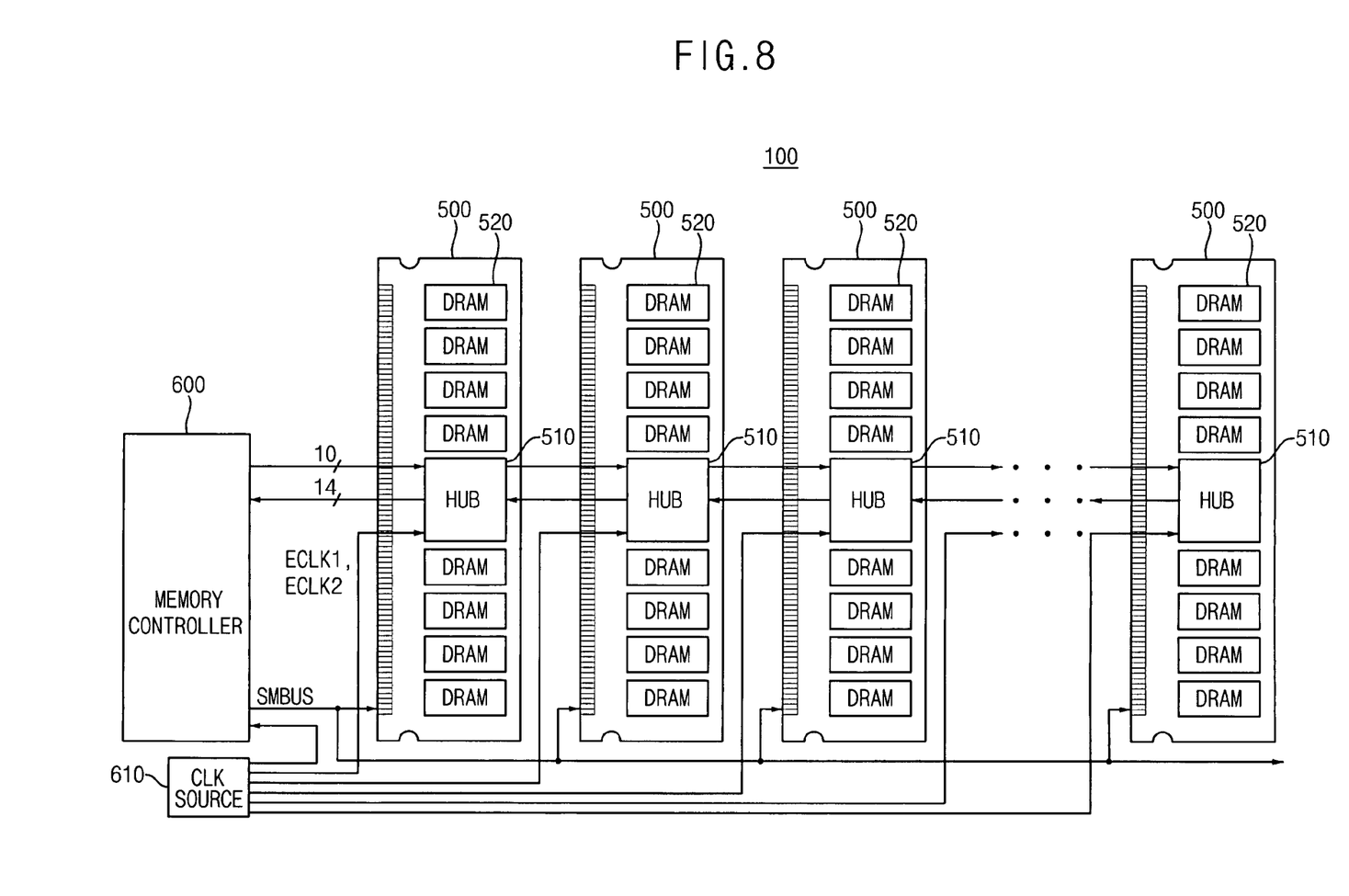
FIG. 8 illustrates a memory system in accordance with an example embodiment of the present invention.

FIG. 8 illustrates a memory system in accordance with an example embodiment of the present invention. As shown in FIG. 8, the memory system 100 may include a memory controller 600, a clock source 610, and a plurality of memory modules 500. Each memory module 500 may further include a plurality of memories, for example, DRAMs 520 and one or more hubs 510.

The memory controller 600 may transfer a southbound packet including data, control, and/or address information 10 in a "downstream" direction to the plurality of memory modules 500 and may receive a northbound packet including data 14 in an "upstream" direction from the plurality of memory modules 500. The memory controller 600 may also communicate with the plurality of memory modules 500 via an SMBus. The clock source 610 may supply periodic and/or non-periodic clocks, such as ECLK1, ECKL2, to the memory controller 600 and/or the plurality of memory modules 500.

In the example embodiment illustrated in FIG. 8, the plurality of memory modules 500 may be single in-line memory modules (SIMMs) or double in-line memory modules (DIMMs). In other example embodiment, the DIMMs may be registered DIMMs (RDIMMs) or fully buffered DIMMs (FB-DIMMs).

Further, in the example embodiment of FIG. 8, the plurality memory modules 500 may be connected to the memory controllers 600 in a daisy chain fashion. In the example embodiment illustrated in FIG. 8, the memory system includes eight (8) memory modules 500 (or eight FBDIMMs).

Figure 9:
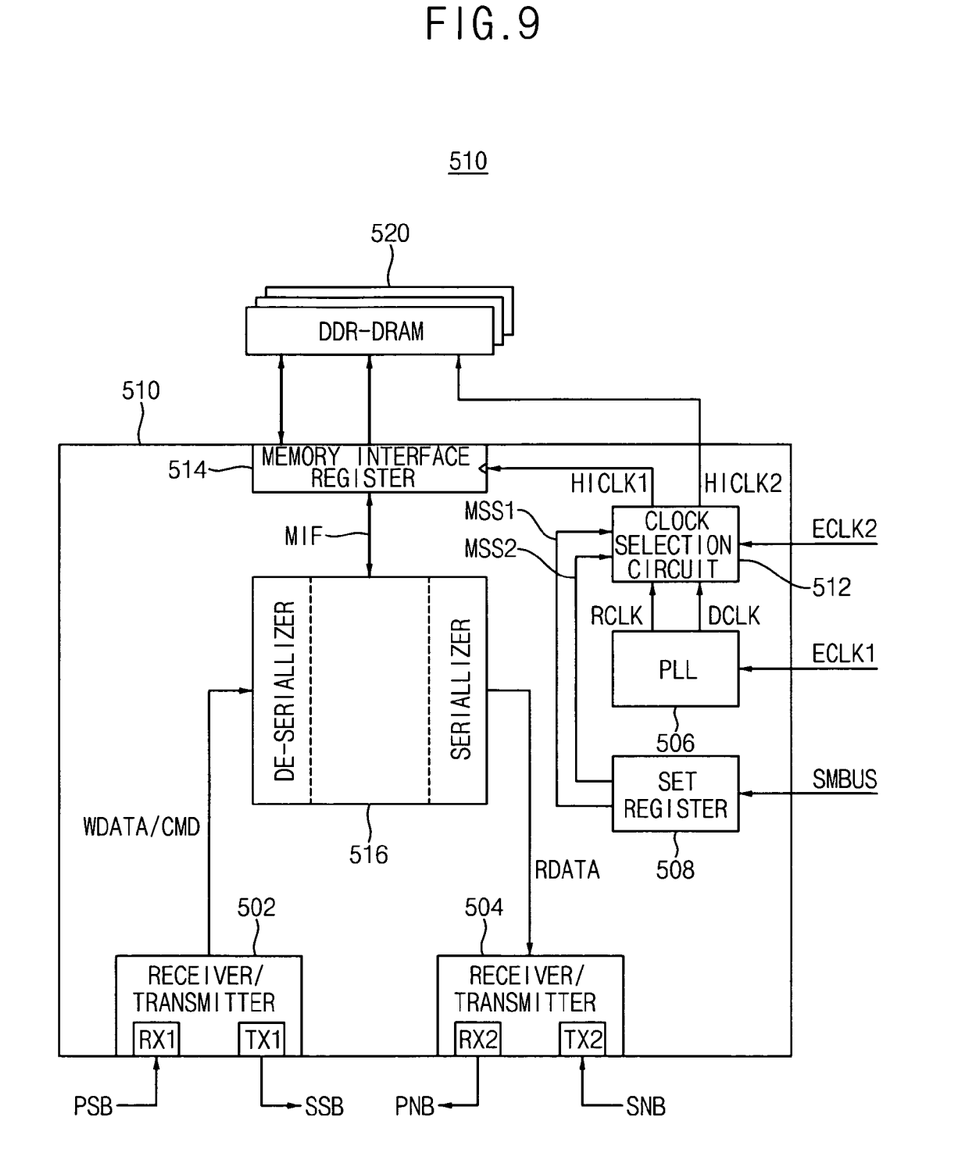
FIG. 9 illustrates a hub of FIG. 8 in accordance with an example embodiment of the present invention.

FIG. 9 illustrates an example of a hub 510 of FIG. 8 in more detail. As illustrated, each hub 510 may include a pair of receiver/transmitters 502, 504, each of which may include a receiver RX2 to receive packets of information PSB from a memory controller 600 of FIG. 8, a receiver RX2 to receive packets of information PNB from other memory modules 500, a transmitter TX1 to transmit packets of information SSB to other memory modules 500, and a transmitter TX2 to transmit packets of information SNB to the memory controller 600 of FIG. 8.

The hub 510 may also include a controller 516, which may further include a serializer for serializing information, such as data including RDATA, to be supplied to receiver/transmitters 502, 504 and a deserializer for deserializing information, such as data including WDATA and commands such as CMD, received from a receiver/transmitters 502, 504.

The controller 516 may also encode a received packet of information into memory information MIF, such as control signals, including /CS, /RAS, /CAS, /WE, and/or similar signals, address signals, and/or data signals and output memory information MIF to a memory interface register 514.

The hub 510 may also include a PLL 506, such as any of the PLLs illustrated in FIGS. 2 or 4-7, for receiving a reference clock, such as CLK or ECLK1, and generating a clock with the same phase RCLK or a clock DCLK having a frequency several times the frequency of the reference clock CLK or ECLK1.

The hub 510 may also include a set register 508, which may receive a mode set signal, for example, through a SMBUS from the memory controller 610 and may output control signals, for example, MSS1 and MSS2, to a clock selection circuit 512, such as any of the clock selection circuits illustrated in FIG. 3 or 5-7. The clock selection circuit 512 may receive a constant periodic clock from the PLL, such as RCLK or DCLK and a non-periodic clock, such as ECLK2, and select one or more clocks form the received clocks according to control signals MSS1 and MSS2 from the set register 508. The clock selection circuit 512 may also output the selected clock(s) as HICLK1, HICLK2 to the memory interface 514 and/or the plurality of memory devices 520 (for example, dual data rate DRAMs (DDR-DRAMs)).

In an example embodiment, in a normal operation, the clock RCLK may be supplied to the memory interface 514 as HICLK1 and the clock DCLK may be supplied to the plurality of memory devices 520 as HICLK2. In another example embodiment, in a test operation, the clock ECLK2 may be supplied to the memory interface register 514 as HICLK1 and the plurality of memory devices 520 as HICLK2.

The memory interface register 514 may output memory information in synchronization with the selected clock(s) HICLK1 to the plurality of memory devices 520. The memory information may include data to and from the plurality of memory devices 520, command information, and/or address information. The memory devices 520 may receive the memory information in synchronization with the HICLK2 and operate according to the memory information supplied.

Figure 10:
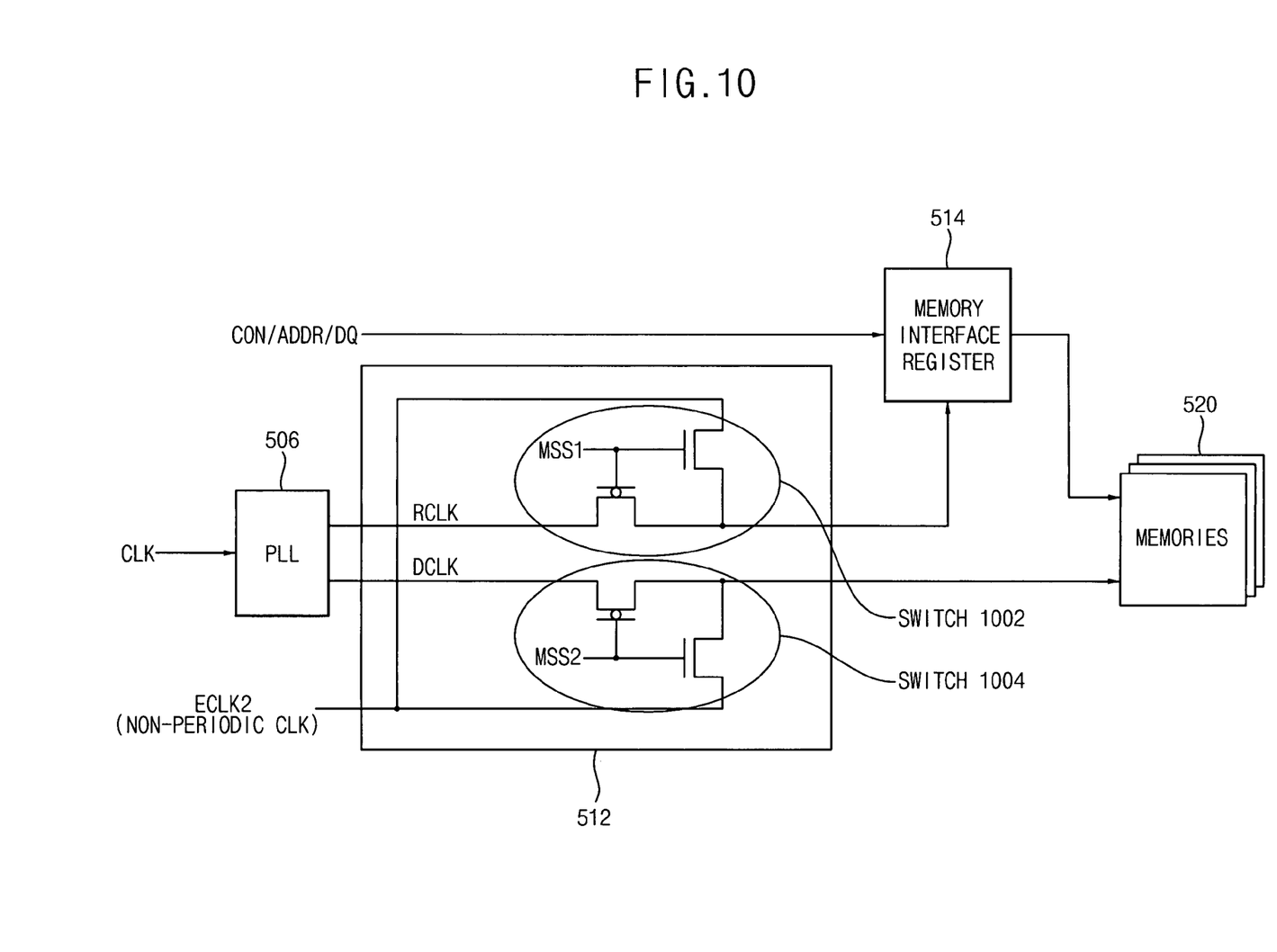
FIG. 10 illustrates a clock selection circuit in accordance with an example embodiment of the present invention.

FIG. 10 illustrates an example embodiment of a clock selection circuit, for example, the clock selection circuit 512 of FIG. 9. As shown, the clock selection circuit 512 may interface with a PLL, such as the PLL 506 of FIG. 9, the memory interface register 514 of FIG. 9, and a plurality of memory devices, 520 of FIGS. 8 or 9.

As illustrated in FIG. 10, control signals MSS1 and MSS2 may be externally supplied, for example, from a set register, such as the set register 508 of FIG. 9.

The clock selection circuit 512 may further include two switches 1002, 1004, which respond to the control signals MSS1 and MSS2, respectively.

Table 2 illustrates example operation to the clock selection circuit 512 of FIG. 10. The first case is a normal operation, in which the memory interface register 514 and the plurality of memory devices 520 operate with periodic clocks. In the second case, the memory interface register 514 operates with a periodic clock and the plurality of memory devices 520 operates with a non-periodic clock, The setup time and the hold time of the input signals to the plurality of memory devices 520 can be controlled by supplying a non-periodic clock In the third case, the memory interface register 514 operates with a non-periodic clock and the plurality of memory devices 520 operates with a periodic clock. As in the second case, the setup time and the hold time can be controlled by supplying a non-periodic clock to the memory interface register 514. In the fourth case, a non-periodic clock is supplied to the memory interface register 514 and to the plurality of memory devices 520, so that the setup time and the hold time again may be controlled.

TABLE 2

| MSS1 | MSS2 | Memory Register | Memory devices |
|---|---|---|---|
| 0 | 0 | periodic CLK | periodic CLK |
| 0 | 1 | periodic CLK | non-periodic CLK |
| 1 | 0 | non-periodic CLK | periodic CLK |
| 1 | 1 | non-periodic CLK | non-periodic CLK |

Figure 11:
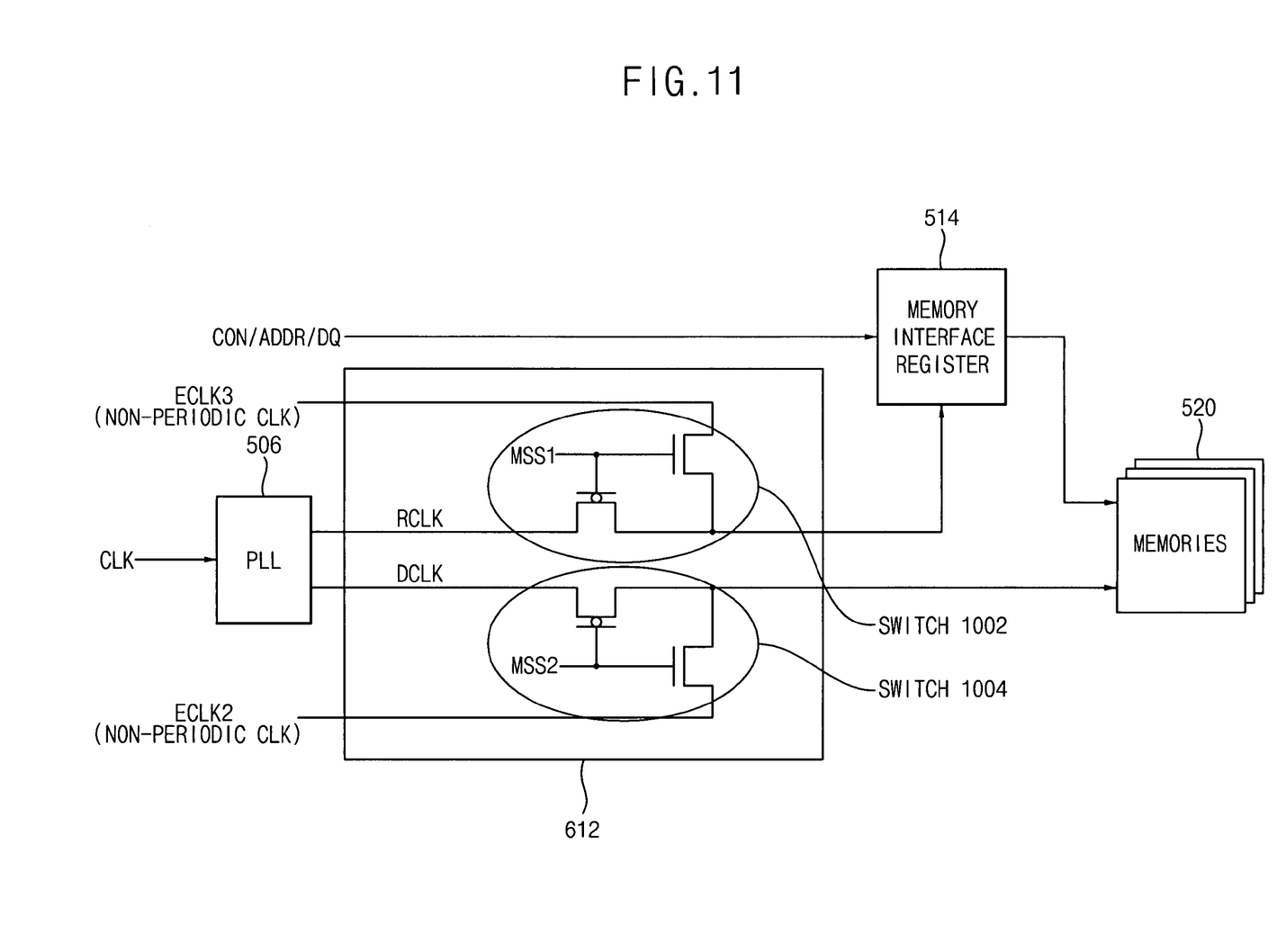
FIG. 11 illustrates another clock selection circuit in accordance with an example embodiment of the present invention.

FIG. 11 illustrates another example embodiment of a clock selection circuit 612, such as the clock selection circuit 512 of FIG. 9. The clock selection circuit 612 of FIG. 11 differs from the clock selection circuit 512 of FIG. 10 in that a second non-periodic clock ECLK3 may be input to the clock selection circuit 612 in response to MSS1 and a non-periodic clocks ECLK2 and ECLK3 may be input to the memory interface register 514 and the plurality of memory devices 520, in response to MSS1 and MSS2, respectively.

Figure 12:
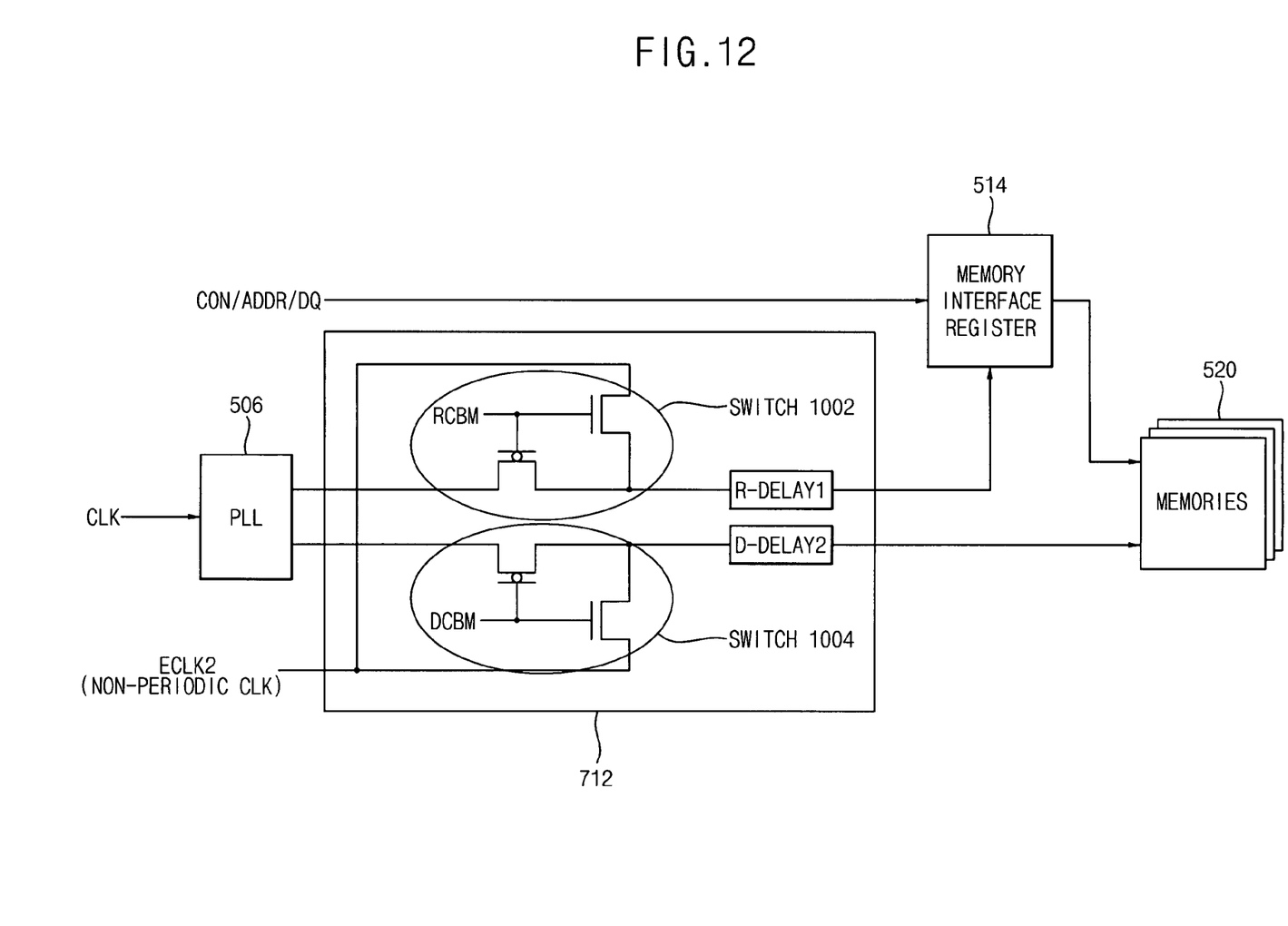
FIG. 12 illustrates another clock selection circuit in accordance with an example embodiment of the present invention.

FIG. 12 illustrates another example embodiment of a clock selection circuit 712, such as the clock selection circuit 512 of FIG. 9. In an example illustrated in FIG. 12, an R-delay 1 is provided between the switch 1002 and the memory interface register 514 and a D-delay 2 is provided between the switch 1004 and the plurality of memory devices 520. The amount of delay provided by the R-delay 1 and D-delay 2 may be controlled utilizing one or more control signals.

Although example embodiments are described above with reference to specific Figures, it is understood that the various features of each of the example embodiments may be combined in any fashion with any of the features of other example embodiments.

Although example embodiments are described above with reference to specific numbers of circuits or signals, it is understood that any number of any circuit or signal could also be used.

It will be apparent to those skilled in the art that other changes and modifications may be made in the above-described example embodiments without departing from the scope of the invention herein, and it is intended that all matter contained in the above description shall be interpreted in an illustrative and not a limiting sense.

We claim:

1. A memory module comprising:
   a phased locked loop receiving an external, periodic clock and generating one or more internal periodic clocks; and
   a plurality of memory units selectively receiving one of the internal periodic clocks or a first non-periodic clock from an external source, the first non-periodic clock being a clock having an irregular period or irregular duty cycle, and each of the plurality of memory units including,
      a mode set circuit receiving an input signal and outputting a mode signal, and
      a clock selection circuit receiving the received periodic clock and the non-periodic clock and outputting either the periodic clock or the non-periodic clock depending on the mode signal.

2. The memory module of claim 1, further comprising:
   a register, receiving one of the internal periodic clocks, control and address information from the external source and supplying the control and address information to the plurality of memory units in synchronization with the received internal periodic clock.

3. The memory module of claim 1, wherein each of the plurality of memory units receives control and address information from the external source.

4. A memory module comprising:
   a phased locked loop receiving an external, periodic clock and generating one or more internal periodic clocks;
   a plurality of memory units selectively receiving one of the internal periodic clocks or a first non-periodic clock from an external source, the first non-periodic clock being a clock having an irregular period or irregular duty cycle;
   a register receiving one of the internal periodic clocks, control and address information from the external source and supplying the control and address information to the plurality of memory units in synchronization with the received internal periodic clock; and
   a clock selection circuit, including a memory clock selection circuit, receiving the first non-periodic clock, the one of the internal periodic clocks and a mode select signal, the memory clock selection circuit providing one of the internal periodic clocks or the first non-periodic clock to the plurality of memory units depending on the mode select signal.

5. The memory module of claim 4, the memory clock selection circuit further including,
   a switch for selectively providing one of the internal periodic clocks or the first non-periodic clock to the plurality of memory units depending on the mode select signal.

6. A memory module comprising:
a phased locked loop receiving an external, periodic clock and generating one or more internal periodic clocks;
a plurality of memory units selectively receiving one of the internal periodic clocks or a first non-periodic clock from an external source, the first non-periodic clock being a clock having an irregular period or irregular duly cycle;
a register receiving control and address information from an external source and supplying the control and address information to the plurality of memory units; and
a clock selection circuit including,
　a memory clock selection circuit receiving the first non-periodic clock, the one of the internal periodic clocks and a first mode select signal, the memory clock selection circuit providing one of the internal periodic clocks or the first non-periodic clock to the plurality of memory units depending on the first mode select signal, and
　a register clock selection circuit receiving the first non-periodic clock, the one of the internal periodic clocks and a second mode select signal, the register clock selection circuit providing one of the internal periodic clocks or the first non-periodic clock to the register depending on the second mode select signal.

7. The memory module of claim 6, the memory clock selection circuit further including a first switch for selectively providing one of the internal periodic clocks or the first non-periodic clock to the plurality of memory units depending on the first mode select signal, and
the register clock selection circuit further including a second switch for selectively providing one of the internal periodic clocks or the first non-periodic clock to the register depending on the second mode select signal.

8. A memory module comprising:
a phased locked loop receiving an external, periodic clock and generating one or more internal periodic clocks;
a plurality of memory units selectively receiving one of the internal periodic clocks or a first non-periodic clock from an external source, the first non-periodic clock being a clock having an irregular period or irregular duty cycle;
a register receiving control and address information from an external source and supplying the control and address information to the plurality of memory units; and
a clock selection circuit including,
　a memory clock selection circuit receiving the first non-periodic clock, the one of the internal periodic clocks and a first mode select signal, the memory clock selection circuit providing one of the internal periodic clocks or the first non-periodic clock to the plurality of memory units depending on the first mode select signal, and
　a register clock selection circuit receiving a second non-periodic clock, the one of the internal periodic clocks and a second mode select signal, the register clock selection circuit providing one of the internal periodic clocks or the second non-periodic clock to the register depending on the second mode select signal.

9. The memory module of claim 8, the memory clock selection circuit further including
a first switch for selectively providing one of the internal periodic clocks or the first non-periodic clock to the plurality of memory units depending on the first mode select signal, and
the register clock selection circuit further including a second switch for selectively providing one of the internal periodic clocks or the second non-periodic clock to the register depending on the second mode select signal.

10. A hub on a memory module, comprising:
a phased locked loop receiving an external, periodic clock and generating one or more internal periodic clocks;
a set register receiving a mode set signal and generating one or more control signals;
a memory interface register receiving memory information and supplying the memory information to a plurality of memory units; and
a clock selection circuit receiving a first non-periodic clock, the one of the internal periodic clocks and the one or more control signals, and providing the one of the internal periodic clocks or the first non-periodic clock to the plurality of memory units and the memory interface register depending on the one or more control signals, wherein
　the first non-periodic clock is a clock having an irregular period or irregular duty cycle.

11. The hub of claim 10, wherein the memory information includes address information, control information, or data.

12. The hub of claim 10, the clock selection circuit including,
a memory clock selection circuit, receiving the first non-periodic clock, the one of the internal periodic clocks and a first of the one or more control signals, the memory clock selection circuit providing the one of the internal periodic clocks or the first non-periodic clock to the plurality of memory units depending on the first of the one or more control signals and
a register clock selection circuit, receiving the first non-periodic clock, the other one of the internal periodic clocks and a second of the one or more control signals, the register clock selection circuit providing the other one of the internal periodic clocks or the first non-periodic clock to the register depending on the second of the one or more control signals.

13. The hub of claim 10, the clock selection circuit including,
a memory clock selection circuit, receiving the first non-periodic clock, the one of the internal periodic clocks and a first of the one or more control signals, the memory clock selection circuit providing the one of the internal periodic clocks or the first non-periodic clock to the plurality of memory units depending on the first of the one or more control signals and
a register clock selection circuit, receiving a second non-periodic clock, the other one of the internal periodic clocks and a second of the one or more control signals, the register clock selection circuit providing the other one of the internal periodic clocks or the second non-periodic clock to the register depending on the second of the one or more control signals.

14. The hub of claim 13, the memory clock selection circuit further including a first delay for delaying the one of the internal periodic clocks or the first non-periodic clock,
the register clock selection circuit further including a second delay for delaying the other one of the internal periodic clocks or the second non-periodic clock.

15. A memory module, comprising:
a plurality of memory units; and
the hub of claim 10.

16. A memory system, comprising:

a plurality of memory modules, each including the hub of claim 10;

a clock source, providing the external, periodic clock and a memory controller, controlling the plurality of memory modules.

17. A memory unit, comprising:

a first input pin receiving a periodic clock in a normal mode;

a second input pin receiving a non-periodic clock in a test mode, the non-periodic clock being a clock having an irregular period or irregular duty cycle;

a clock selection circuit, receiving the periodic clock and the non-periodic clock and outputting either the periodic clock or the non-periodic clock, depending on a mode selection signal; and a clock buffer receiving either the periodic clock or the non-periodic clock from the clock select circuit and outputting an internal clock.

18. The memory unit of claim 17, the second input pin receiving a data strobe signal or data mask signal when in the normal mode and the non-periodic clock in the test mode.

19. The memory unit of claim 18, the clock selection circuit comprising a first switch selecting the periodic clock in response to first state of the mode selection signal and outputting the periodic clock to the clock buffer and a second switch selecting the non-periodic clock in response to a second state of the mode selection signal and outputting the non-periodic clock to the clock buffer.

20. The memory unit of claim 19, the clock selection circuit further comprising a third switch selecting the data strobe signal or the data mask signal in response to the first state of the mode selection signal outputting a data strobe buffer or a data mask buffer in response to the first state of the mode selection signal.

* * * * *